US007538708B2

(12) United States Patent  
Xu

(10) Patent No.: US 7,538,708 B2  
(45) Date of Patent: May 26, 2009

(54) EFFICIENT, SELECTIVE ERROR REDUCTION FOR PARALLEL, TIME-INTERLEAVED ANALOG-TO-DIGITAL CONVERTER

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/967,290

(22) Filed: Dec. 31, 2007

(65) Prior Publication Data

US 2008/0158029 A1 Jul. 3, 2008

Related U.S. Application Data

(63) Continuation-in-part of application No. 11/618,792, filed on Dec. 30, 2006.

(51) Int. Cl.  
*H03M 1/12* (2006.01)

(52) U.S. Cl. .................. 341/155; 341/117; 341/118; 341/119; 341/120

(58) Field of Classification Search ......... 341/117–120, 341/155  
See application file for complete search history.

(56) References Cited

U.S. PATENT DOCUMENTS

| | | | | |
|---|---|---|---|---|
| 4,547,862 A | | 10/1985 | McIver et al. | |
| 4,763,105 A | * | 8/1988 | Jenq | 341/120 |
| 6,384,756 B1 | * | 5/2002 | Tajiri et al. | 341/120 |
| 6,522,282 B1 | * | 2/2003 | Elbornsson | 341/155 |
| 6,700,515 B2 | * | 3/2004 | Asami | 341/120 |
| 6,801,145 B2 | * | 10/2004 | Asami | 341/118 |
| 6,809,668 B2 | * | 10/2004 | Asami | 341/120 |
| 7,049,984 B2 | * | 5/2006 | Wood et al. | 341/120 |
| 7,084,793 B2 | * | 8/2006 | Elbornsson | 341/118 |

OTHER PUBLICATIONS

Wikipedia.Org, "Cooley-Tukey FFT Algorithm," downloaded Jan. 9, 2008 from http://en.wikipedia.org/wiki/Cooley-Tukey FFT algorithm.  
Douglas L. Jones, "Decimation-in-time (DIT) Radix-2 FFT," Sep. 15, 2006, http://cnx.org/content/m12016/latest/.  
Douglas L. Jones, "Radix-4 FFT Algorithms," Sep. 18, 2006, http://cnx.org/content/m12027/latest/.

* cited by examiner

*Primary Examiner*—Jean B Jeanglaude  
(74) *Attorney, Agent, or Firm*—Bruce O. Rubenstein

(57) ABSTRACT

A technique for reducing errors in a PTIC (parallel, time-interleaved analog-to-digital converter) consisting of M ADCs involves sampling an input signal with the PTIC and performing M different DFTs, one for each ADC. Elements of the M DFTs are grouped together according to bin number. If all elements corresponding to the same bin number exceed a predetermined threshold, the elements are multiplied by correction matrices to yield corrected, DFT terms for a reconstructed power spectrum. If they do not exceed the threshold, DFT elements are processed to produce uncorrected DFT terms for the reconstructed power spectrum.

26 Claims, 9 Drawing Sheets

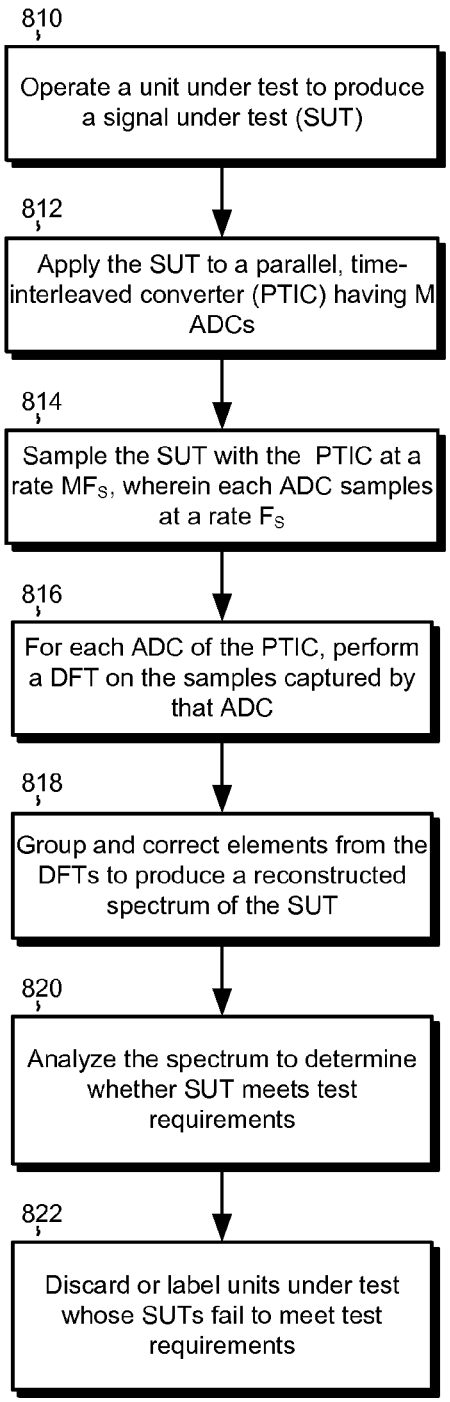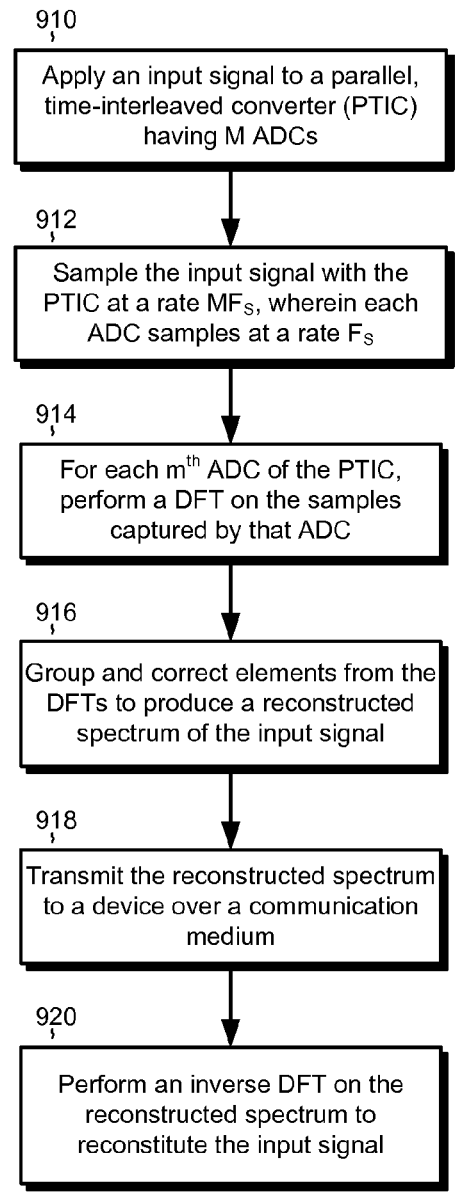
Fig. 8
Fig. 9

EFFICIENT, SELECTIVE ERROR REDUCTION FOR PARALLEL, TIME-INTERLEAVED ANALOG-TO-DIGITAL CONVERTER

CROSS-REFERENCES TO RELATED APPLICATIONS

This is a continuation-in-part of U.S. patent application Ser. No. 11/618,792, filed Dec. 30, 2006.

STATEMENT REGARDING FEDERALLY SPONSORED RESEARCH OR DEVELOPMENT

Not Applicable.

NAMES OF PARTIES TO A JOINT RESEARCH AGREEMENT

Not Applicable

REFERENCE TO A "SEQUENCE LISTING," A TABLE, OR A COMPUTER PROGRAM LISTING APPENDIX

Not Applicable.

BACKGROUND OF THE INVENTION

1. Field of the Invention

This invention relates generally to techniques for converting analog signals into digital signals, and, more particularly, to techniques for correcting errors in sampled data acquired from time-interleaved analog-to-digital converters.

2. Description of Related Art

In many applications, a need arises for converting analog signals into corresponding digital codes. One of these applications is automatic test equipment, or ATE. ATE systems are generally complex electronic systems for verifying the operation of electronic devices or assemblies.

FIG. 1 is a high level block diagram of an ATE system, or "tester." A host computer 110 runs a test program developed for testing a unit under test, or UUT 118. The host computer 110 interactively communicates with a clock distribution circuit 112 and source/capture instruments 114. These instruments provide stimuli to and monitor responses from the UUT 118 via an interconnect 116. Examples of testers are well known in the art, and include the Catalyst™, Tiger™, Panther™, FLEX™ and UltraFLEX™ test systems designed by Teradyne, Inc. of North Reading, Mass.

In ATE as well as other applications, electronic signals are generally converted from analog to digital form through the use of devices called analog-to-digital converters, or ADCs. An ADC is a device that generally has an analog input, for receiving an analog signal to be converted, and a digital output, for providing a converted, digital rendition of the analog signal. Conversions take place at precise instants of time, as defined by a clock signal applied to a clock input of the ADC.

An ADC is generally clocked at a fixed sampling rate, $F_S$. As is known, the maximum frequency that an ADC can unambiguously represent is limited by Shannon's Theory to one-half the sampling rate. This frequency, $F_S/2$, is commonly called the "Nyquist rate."

More generally, ADCs can unambiguously represent analog signals over any maximum bandwidth of $F_S/2$. Outside this bandwidth, a phenomenon called "aliasing" occurs, wherein frequency content outside the band folds back and superimposes within the band. Aliasing is generally regarded as an error, and the analog input signal is typically band limited (filtered) to avoid aliasing.

An important specification of an ADC is its maximum sampling rate—the maximum clock frequency that the device can handle before it fails to operate or errors occur. Because the Nyquist rate is half the sampling rate, the maximum sampling rate directly limits the maximum frequency that an ADC can unambiguously capture.

To overcome this limitation, designers have developed circuits consisting of many ADCs operated concurrently. An example of this type of circuit, called a parallel, time-interleaved converter, or "PTIC," is shown in FIG. 2. There, M different ADCs 210a-210m have their analog inputs connected together to receive the same input signal, Analog In. A buffer amplifier (not shown) is often provided at the input of each ADC. A clock generator, such as the clock distribution circuit 112, provides a clock signal to each of the ADCs. The clock signals are operated at the same frequency, $F_S$, but are uniformly spaced in time, such that the delay between successive clocks is approximately $1/MF_S$. A sequencer 212 receives the digital signals from the M ADCs and outputs them, in the order in which they are converted, to produce a combined output signal, Digital Out. Although each ADC operates at a rate of only $F_S$, the circuit as a whole operates at $MF_S$, i.e., a new sample is generated every $1/MF_S$ seconds. The sampling rate, and therefore the Nyquist rate, is effectively increased by a factor of M.

To analyze spectral content of captured signals, the PTIC 200 includes a capture memory 214 and a Discrete Fourier Transform, or "DFT" unit 216. The capture memory 214 holds sequences of sampled signals from Digital Out, and the DFT unit 216 transforms the sampled sequences into power spectra.

This parallel, time-interleaved approach has been used with great success for decades. However, certain obstacles have limited its application. For instance, it is known that different converters are never precisely identical. This is true even when converters are nominally of the same type (e.g., the same manufacturer, model, and grade). Differences between converters cause each of them to convert the analog input signal in slightly different ways. These differences introduce errors in Digital Out. Also, the clock signals feeding the different converters are never exactly aligned with their ideal positions. There is always some timing skew, and this skew introduces additional errors.

Circuit designers have previously developed techniques for correcting errors among the different converters. For instance, developers have prescribed calibration procedures for correcting offset, gain, and phase. For correcting offset errors, offset errors are measured for each converter prior to operation. During operation, samples are individually corrected by subtracting the measured offsets. Gain errors have been addressed in a similar way, by measuring gain errors of each converter and applying them to correct individual samples. Phase errors have also been addressed, by slightly delaying or advancing clock signals to each converter. These errors, extremely pronounced in the frequency domain as spur components, increase as discrepancies between converters become greater.

Although these techniques have achieved some degree of effectiveness, they are far from optimal. For example, they do not generally account for variations in gain and phase that change with input signal frequency. Therefore, corrections that work for one input frequency often do not work optimally for different input frequencies.

What is needed is a way of correcting for errors among converters in parallel, interleaved topologies, which accounts for the frequency dependency of gain and phase.

BRIEF SUMMARY OF THE INVENTION

In accordance with one embodiment of the invention, a method of testing signals with a PTIC (parallel, time-interleaved converter) includes stimulating a UUT (unit under test) to produce an SUT (signal under test), which has at least one test requirement, and applying the SUT to a PTIC. The PTIC includes M ADCs (analog-to-digital converters) each clocked at a rate $F_S$ and time-interleaved to provide an overall sampling rate of $MF_S$. The method further includes acquiring a series of samples of the SUT by each of the M ADCs of the PTIC. A DFT (Discrete Fourier Transform) is performed on each series of samples to yield M DFTs. The method still further includes sorting the DFT elements from the M DFTs into a plurality of groups according to bin number, wherein each group of the plurality of groups includes M DFT elements each corresponding to the same bin number. For each group, a determination is made as to whether correction for that group is desired. If it is, then each group is processed with a collection of correction factors to produce M corrected DFT terms. If correction is not desired, M uncorrected DFT terms are generated. The corrected and uncorrected DFT terms are placed together to form a reconstructed spectrum of the SUT. The reconstructed spectrum is analyzed to determine whether the UUT meets the at least one test requirement, and the UUT is passed, failed, or graded depending on the test result.

In accordance with another embodiment, a method of transmitting and receiving a signal includes applying a signal to a PTIC (parallel, time-interleaved converter) that includes M ADCs (analog-to-digital converters) each clocked at a rate $F_S$ and time-interleaved to provide an overall sampling rate of $MF_S$. A series of samples are acquired of the signal by each of the M ADCs of the PTIC, and a DFT (Discrete Fourier Transform) is performed on each series of samples to yield M DFTs. The method further includes sorting the DFT elements from the M DFTs into a plurality of groups according to bin number, wherein each group includes M DFT elements each corresponding to the same bin number. It is not necessary to physically group the DFT elements. Any arrangement for associating elements of the same group with one another will suffice. For each group, a determination is made as to whether correction is desired for that group. If it is, the group is processed with a collection of correction factors to produce M corrected DFT terms. If correction is not desired, M uncorrected DFT terms are generated. Corrected and uncorrected DFT elements are placed together to form a reconstructed spectrum of the signal. The method still further includes transmitting the reconstructed spectrum to a receiving circuit, and performing and inverse DFT on the received, reconstructed spectrum to reconstruct the signal.

In accordance with yet another embodiment, a circuit for analyzing a signal includes an input and a clock generator for generating M clocks each operable at a rate $F_S$ and each having a different phase. The circuit further includes M ADCs, each having an analog input coupled to the input, a digital output, and a clock input coupled to the clock generator for receiving a respective one of the M clocks. M DFT units are respectively coupled to the digital outputs of the M ADCs and are constructed and arranged for producing DFT elements. The circuit also includes a processor, coupled to the M DFT units, for processing the DFT elements from the M DFT units to produce a reconstructed spectrum. The processor has a first portion for producing corrected DFT terms of the reconstructed spectrum and a second portion for producing uncorrected DFT terms of the reconstructed spectrum.

BRIEF DESCRIPTION OF THE SEVERAL VIEWS OF THE DRAWINGS

Aspects of the invention disclosed herein may be better understood by reference to the attached drawings, wherein:

FIG. 8 is a flowchart showing a process for applying a correction technique according to an embodiment of the invention in a testing application;

FIG. 9 is a flowchart showing a process for applying a correction technique according to an embodiment of the invention in an application for transmitting and receiving signals;

DETAILED DESCRIPTION OF THE INVENTION

As used throughout this document, the words "comprising," "including," and "having" are intended to set forth certain items, steps, elements, or aspects of something in an open-ended fashion. Unless a specific statement is made to the contrary, these words indicate an open list to which additional things can be added.

The following definitions are supplied to promote an understanding of the concepts disclosed herein:

PTIC A parallel, time-interleaved converter including M ADCs having analog inputs coupled together and clock inputs receiving clocks of the same frequency but different phase.

M The total number of ADCs in the parallel, time-interleaved converter circuit.

m An index ranging from 1 to M used to identify a particular one of the M ADCs.

N The number of samples acquired by each ADC; alternatively, the number of frequency coefficients of a Discrete Fourier Transform produced from the output of each ADC.

n An index representing a sample acquired from a particular ADC, or from the ADCs operating together; alternatively, an index representing a particular coefficient of a DFT.

FMAF A "Family of Mutually Aliased Frequencies." A set of M frequencies between 0 and $MF_S/2$ that alias to the same frequency when sampled at a rate $F_S$.

i An index used to identify a particular FMAF. Alternatively, an index used to identify a particular sample acquired by an ADC.

x(t) The time varying input signal applied to the ADCs in a PTIC.

$\tilde{x}(t)$ The time varying version of the sampled input signal, including any gain and phase errors.

$\tilde{x}_m(t)$ The time varying version of the input signal sampled by the $m^{th}$ ADC, including gain and phase errors of that ADC.

$\tilde{x}_{m,i}(t)$ A particular sample from a particular ADC, specifically, the $i^{th}$ sample acquired from the $m^{th}$ ADC.

$\tilde{X}_{m,i}$ The frequency domain representation of $\tilde{x}_{m,i}(t)$.

$\hat{x}(t)$ The time varying version of the input signal, corrected for gain and phase errors.

$\hat{X}$ The frequency domain version of the corrected input signal, $\hat{x}(t)$.

τ The actual delay of an ADC's conversion relative to a clock for a first ADC of the PTIC.

Figure 1:
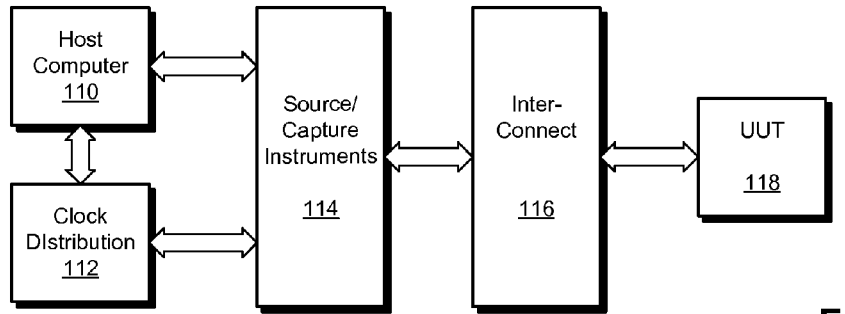
FIG. 1 is a block diagram of Automatic Test Equipment, according to the prior art.
Figure 2:
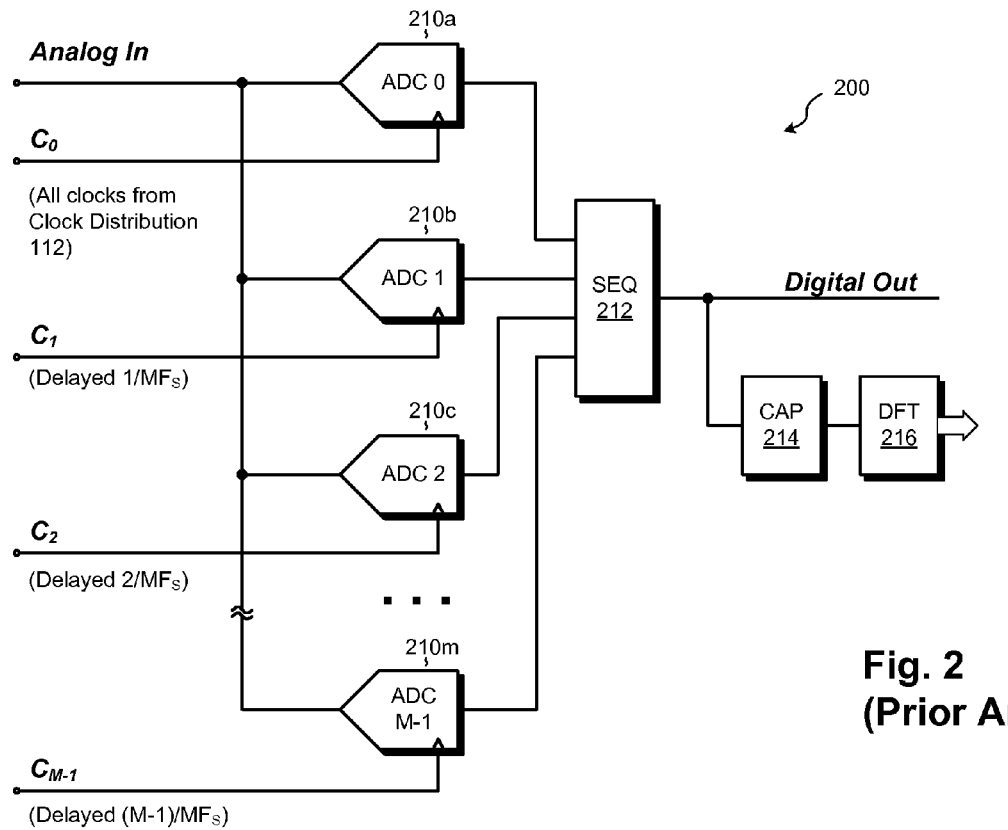
FIG. 2 is a simplified schematic of a parallel, time-interleaved analog-to-digital converter (PTIC), according to the prior art.

For the PTIC of FIG. 1, it was seen that an effective bandwidth of $MF_S/2$ is achieved even though each ADC is operated at only $F_S$. The process of interleaving effectively multiplies the sampling rate. We have recognized, however, that, despite this multiplication, all information about the input signal must be included within the bandwidths of the individual ADCs, i.e., within $F_S/2$. From the perspective of the individual converters of the PTIC, all information about input frequencies above $F_S/2$ is represented as aliased content within the band from DC to $F_S/2$, i.e., the Nyquist band.

Therefore, if a DFT is performed on the series of samples acquired by any of the M converters, each bin "n" of the DFT will include information not only about a frequency $F_n$ within the Nyquist band, but also information about all other frequencies between DC and $MF_S/2$, which alias to bin n. Because aliasing occurs at integer multiples of the sampling rate, plus or minus $F_n$, there are precisely M−1 frequencies outside the Nyquist band that alias to bin n. Said another way, each bin n of the DFT contains information about M different frequencies: the frequency $F_n$ and all frequencies within the band that alias to bin n. Together, these M frequencies form a family of mutually aliased frequencies, or "FMAF."

If information about M different frequencies is found in bin n, then the origin of the frequency content of bin n is ambiguous. One cannot tell whether it comes from $F_n$, from one or more of the aliased frequencies, or from some combination thereof.

A mathematical model has been developed to resolve this ambiguity. The model relies upon the fact that, although M different frequencies contribute to the content of any DFT bin n, there are also M different ADCs from which DFTs may be taken. Therefore, for any bin n, M different equations may be constructed, one for each ADC, wherein each equation has M unknowns. A different set of equations can be constructed for each value of n from 0 to N−1, i.e., for each bin of the DFT. Therefore, the entire spectrum from DC to $MF_S/2$ can be reconstructed from DFTs of the individual converters. As shown herein, the mathematical model also provides a particularly convenient way of correcting for errors in the frequency domain.

We begin by recognizing that any periodic signal can be represented as a series of MN equal spaced values $X_n$ in a bandwidth-limited frequency domain F, with $MF_S=F$. Prior to sampling, the time varying input signal can be defined by an inverse Fourier series:

$$x(t) = \sum_{n=-MN/2}^{MN/2-1} X_n e^{j2\pi \frac{nF}{MN}t}, \qquad \text{(EQ. 1)}$$

where MN is the total number of samples. The signal x(t) is real valued, as this is the only form that amplifiers and converters can manipulate. If this continuous time domain waveform is sampled by a converter m, m ∈[0,M[ at a sampling frequency $F_S$, or at a sampling interval $T=1/F_S$, we have $$\tilde{x}_m(t) = \sum_{n=-MN/2}^{MN/2-1} \tilde{H}_{m,n} X_n e^{j2\pi \frac{nF_S}{N}t} \qquad \text{(EQ. 2)}$$

$\tilde{H}_{m,n}$ has been introduced in EQ. 2 to represent the complex gain of the signal path, including any gain and phase errors, through converter m at frequency $f=nF_S/N$, referenced to the converter's clock. When samples of these M converters are interleaved, we obtain a series of samples in the time domain:

$$x_0 = \tilde{x}_0(\tau_0), x_1 = \tilde{x}_1(\tau_1), \qquad \text{(EQ. 3)}$$

$$x_M = \tilde{x}_0(T+\tau_0), x_{M+1} = \tilde{x}_1(T+\tau_1),$$

$$x_{2M} = \tilde{x}_0(2T+\tau_0), x_{2M+1} = \tilde{x}_1(2T+\tau_1),$$

These represent actual samples acquired from ADCs. The term $x_0$ and the terms that follow on the first line above represent the first sample acquired from each converter (0 to M−1). The term $x_M$ and the terms that follow on the second line represent the second sample acquired from each converter, and $x_{2M}$ and the terms that follow on the third line represent the third sample from each converter.

The quantity $\tau_m$ is defined for m=0 to M−1 and represents a sampling delay of the clock of the $m^{th}$ converter relative to the clock of the first converter (m=0). We notice a special case of $\tau_m = m/MF_S$, wherein samples from all converters are uniformly distributed.

From all of the samples $x_0, x_1, \ldots x_M, x_{M+1}, \ldots, x_{MN-1}$ acquired by the M converters, we can designate the samples from any one converter m as $x_m, x_{m+M}, x_{m+2M}, x_{m+nM}, \ldots, x_{m+M(N-1)}$. Let us denote these samples $$\tilde{x}_{m,i}|_{m\in[0,M-1[,i\in[0,N-1[}, \qquad \text{(EQ. 4)}$$

where each value of i corresponds to a family of mutually aliased frequencies (FMAF).

An objective of this process is to estimate all corrected frequency components $\hat{X}$ of X. By putting EQ. 4 in the context of EQ. 3, we obtain:

$$\tilde{x}_{m,i} = \tilde{x}_m(iT + \tau_m)|_{i\in[0,N[}. \qquad \text{(EQ. 5)}$$

Next, by plugging EQ. 5 into EQ. 2 we obtain:

$$= \sum_{n=-MN/2}^{MN/2-1} \tilde{H}_{m,n} \tilde{X}_n e^{j2\pi \frac{nF_S}{N}(iT-\tau_m)} \bigg|_{i\in[0,N[} \qquad \text{(EQ. 6)}$$

Last, we expand EQ. 6 to obtain:

$$\tilde{x}_{m,i}\big|_{i\in[0,N[} = \sum_{n=-MN/2}^{MN/2-1} \tilde{H}_{m,n} e^{j2\pi \frac{nF_S \tau_m}{N}} \hat{X}_n e^{j2\pi \frac{ni}{N}} \bigg|_{i\in[0,N[} \quad (EQ. 7)$$

Now, we denote a new term, $$H_{m,n} = \tilde{H}_{m,n} e^{j2\pi f \tau_m}, \quad (EQ. 8)$$

as the complex gain of the converter m at frequency $f=nF_S/N$, referenced to a common system clock. $H_{m,n}$ is a useful definition because this quantity can be computed from direct measurements.

We notice that the delay $\tau_m$ of each individual converter is included in EQ. 8 via the expression $e^{j2\pi f \tau_m}$. Substituting EQ. 8 into EQ. 7, we obtain:

$$\tilde{x}_{m,i}\big|_{i\in[0,N[} = \sum_{n=-MN/2}^{MN/2-1} H_{m,n} \hat{X}_n e^{j2\pi \frac{ni}{N}} \bigg|_{i\in[0,N[} \quad (EQ. 9)$$

$$= \sum_{k=-M/2}^{M/2-1} \sum_{n=0}^{N-1} H_{m,kN+n} \hat{X}_{kN+n} e^{j2\pi \frac{(kN+n)i}{N}} \bigg|_{i\in[0,N[}$$

$$= \sum_{n=0}^{N-1} \left( \sum_{k=-M/2}^{M/2-1} H_{m,kN+n} \hat{X}_{kN+n} \right) e^{j2\pi \frac{ni}{N}} \bigg|_{i\in[0,N[}$$

In this last expression, the term $$\sum_{k=-M/2}^{M/2-1} H_{m,kN+n} \hat{X}_{kN+n} \bigg|_{n\in[0,N[}$$

represents the weighted alias of signals from the bandwidth of $MF_S$ into the bandwidth $F_S$. The weight is the complex gain of converter m.

We can recognize that the expression above is the inverse Discrete Fourier transform of the weighted alias signal. Now we can apply a Fourier transform on both sides of the equation, to obtain $$\frac{1}{N} \sum_{n=0}^{N-1} \tilde{x}_{m,n} e^{-j2\pi \frac{ni}{N}} \bigg|_{i\in[0,N[} = \sum_{k=-M/2}^{M/2-1} H_{m,kN+i} \hat{X}_{kN+i} \bigg|_{i\in[0,N[} \quad (EQ. 10)$$

or $$\sum_{k=-M/2}^{M/2-1} H_{m,kN+i} \hat{X}_{kN+i} \bigg|_{i\in[0,N[} = \tilde{X}_{m,i}, \quad (EQ. 11)$$

where $\tilde{X}_{m,i}$ denotes the Discrete Fourier transform of samples captured by converter m. As a result of aliasing, this Fourier transform has N samples instead of MN.

For a given value i, we have M unknowns $$\hat{X}_{kN+i}\big|_{k\in[0,M-1[}$$

with their coefficients $$H_{m,kN+1i}\big|_{k\in[0,M-1[}.$$

We also have one scalar, $$\tilde{X}_{m,i} = \frac{1}{N} \sum_{n=0}^{N-1} x_{m+nM} e^{-j2\pi \frac{ni}{N}}. \quad (EQ. 12)$$

As we have M converters, we can get M equations like EQ. 12. If we denote $$\hat{X}_C = \begin{pmatrix} \hat{X}_{-MN/2+i} \\ \vdots \\ \hat{X}_{kN+i} \\ \vdots \\ \hat{X}_{(M/2-1)N+i} \end{pmatrix}, \tilde{X}_C = \begin{pmatrix} \tilde{X}_{0,i} \\ \vdots \\ \tilde{X}_{m,i} \\ \vdots \\ \tilde{X}_{M-1,i} \end{pmatrix}$$

and $$H_C = \begin{pmatrix} H_{0,-MN/2+i} & \cdots & H_{0,kN+i} & \cdots & H_{0,(M/2-1)N+i} \\ \vdots & \cdots & \vdots & \cdots & \vdots \\ H_{m,-MN/2+i} & \cdots & H_{m,kN+i} & \cdots & H_{m,(M/2-1)N+i} \\ \vdots & \cdots & \vdots & \cdots & \vdots \\ H_{M-1,-MN/2+i} & \cdots & H_{M-1,kN+i} & \cdots & H_{M-1,(M/2-1)N+i} \end{pmatrix},$$

then we can write M equations of (EQ. 12) in the form:

$$H_C \hat{X}_C = \tilde{X}_C \quad (EQ. 13)$$

As the index i varies from 0 to N−1, we have N linear systems, each comprising M equations of M unknowns, to reconstruct the signal of MN samples in frequency domain.

Since each value of i represents a family of mutually aliased frequencies (FMAF), EQ. 13 provides a complete linear system for each FMAF. Linear systems for different FMAFs are orthogonal from one another, since frequencies from one FMAF cannot alias into other FMAFs.

Each instance of EQ. 13 can be solved for $\hat{X}_C$ by inverting the respective matrix, $H_C$. Both sides of EQ. 13 can then be multiplied by $H_C^{-1}$ to yield $$\hat{X}_C = H_C^{-1} \tilde{X}_C. \quad (EQ. 14)$$

Because $\tilde{X}_C$ represents DFT values acquired from individual ADCs and $H_C^{-1}$ can be computed from measured values, EQ. 14 provides a straightforward way to compute a corrected spectrum of a PTIC as a whole from the spectra obtained from individual converters.

Although the principles described hereinabove are sufficient for achieving complete frequency reconstruction, we have recognized that reconstruction can be simplified in most cases by virtue of Hermitian symmetry. Because the input signal and the outputs of the ADCs are all real valued, $H_{m,i}$, $\hat{X}_i$, and $DFT_i^{-1}(\tilde{x}_{m,n})$ all respect Hermitian symmetry: i.e., $H_{m,-i} = H^*_{m,i}$, $\hat{X}_{-i} = \hat{X}^*_i$ and $$DFT_{-i}(\tilde{x}_{m,n}) = DFT_{N-i}(\tilde{x}_{m,n}) = DFT^*_i(\tilde{x}_{m,n}) \quad (EQ. 15)$$

Hermitian symmetry requires that, for nearly half of the total equations, where index i varies from N/2+1 to N−1, the solutions to EQ. 14 are redundant. Most implementations of the Fourier Transforms take this symmetry into account, and the "negative" part of the spectrum, which can be obtained from Hermitian symmetry, $$DFT_i(\tilde{x}_{m,n})\big|_{i\in[N/2,N[} = DFT^*_{N-i}(\tilde{x}_{m,n})\big|_{i\in]0,N/2[} \quad (EQ. 16)$$

and is neither computed nor saved: Thus, for i≠0 the alias term becomes:

$$\sum_{k=-M/2}^{M/2-1} H_{m,kN+i}\hat{X}_{kN+i}\bigg|_{i\in[1,N/2[} = \begin{pmatrix} \sum_{k=0}^{M/2-1} H_{m,kN+i}\hat{X}_{kN+i} + \\ \sum_{k=-M/2}^{-1} H_{m,kN+i}\hat{X}_{kN+i} \end{pmatrix}\bigg|_{i\in[1,N/2[}$$

$$= \begin{pmatrix} \sum_{k=0}^{M/2-1} H_{m,kN+i}\hat{X}_{kN+i} + \\ \sum_{k=1}^{M/2} H^*_{m,kN-i}\hat{X}^*_{kN-i} \end{pmatrix}\bigg|_{i\in[1,N/2[}$$

$$= \sum_{k=0}^{M/2-1} \begin{pmatrix} H_{m,kN+i}\hat{X}_{kN+i} + \\ H^*_{m,kN+(N-i)}\hat{X}^*_{kN+(N-i)} \end{pmatrix}\bigg|_{i\in[1,N/2[}$$

(EQ. 17)

Therefore, we have:

$$\sum_{k=0}^{M/2-1}\left(H_{m,kN+i}\hat{X}_{kN+i} + H^*_{m,kN+(N-i)}\hat{X}^*_{kN+(N-i)}\right)\bigg|_{i\in]0,N/2[} = \tilde{X}_{m,i}$$

(EQ. 18)

If we now denote $$\hat{X}_R = \begin{pmatrix} \hat{X}^*_{(MN/2)-i} \\ \hat{X}^*_{kN+(N-i)} \\ \hat{X}^*_{N-i} \\ \hat{X}_i \\ \hat{X}_{kN+i} \\ \hat{X}_{(M/2-1)N+i} \end{pmatrix}, \tilde{X}_R = \begin{pmatrix} \tilde{X}_{0,i} \\ \vdots \\ \tilde{X}_{m,i} \\ \vdots \\ \tilde{X}_{M-1,i} \end{pmatrix} \text{ and }$$

$$H_R = \begin{pmatrix} H^*_{0,MN/2-i} & H^*_{0,kN+(N-i)} & H^*_{0,N-i} & H_{0,i} & H_{0,kN+i} & H_{0,(M/2-1)N+i} \\ \vdots & \vdots & \vdots & \vdots & \vdots & \vdots \\ H^*_{m,MN/2-i} & H^*_{m,kN+(N-i)} & H^*_{m,N-i} & H_{m,i} & H_{m,kN+i} & H_{m,(M/2-1)N+i} \\ \vdots & \vdots & \vdots & \vdots & \vdots & \vdots \\ H^*_{M-1,MN/2-i} & H^*_{M-1,kN+(N-i)} & H^*_{M-1,N-i} & H_{M-1,i} & H_{m-1,kN+i} & H_{M-1,(M/2-1)N+i} \end{pmatrix}$$

then we have $$H_R \hat{X}_R = \tilde{X}_R \quad \text{(EQ. 19)}$$

or $$\hat{X}_R = H_R^{-1} \tilde{X}_R \quad \text{(EQ. 20)}$$

For each value of i, there are still M equations and M unknowns, but the number of values of i and therefore the total number of equations to be solved has been reduced approximately by half.

Because it requires less computation, EQ. 20 is preferred over EQ. 14 for performing spectral reconstruction. However, we have recognized that EQ. 20 cannot readily be used for Nyquist frequencies, i.e., frequencies that occur at integer multiples of $F_S/2$. For these frequencies, EQ. 14 should be used. We also note that, regardless of which equation is used, complete reconstruction of the bandwidth between DC and $MF_S/2$ can be achieved by applying calibration values $H_{m,n}$ obtained from only N/2+1 different values if FMAFs. This is the case since Hermitian symmetry makes calibration values for the additional N/2−1 FMAFs redundant.

The model set forth hereinabove allows correction to be applied to each bin of a reconstructed spectrum over the full range from DC to $MF_S/2$. Because the terms $H_{m,n}$ account for both gain and phase, they allow components of the reconstructed spectrum to be individually corrected for gain and phase. And since different values of $H_{m,n}$ are applied for different frequencies, correction is achieved even when gain and phase vary with input signal frequency.

Figure 3:
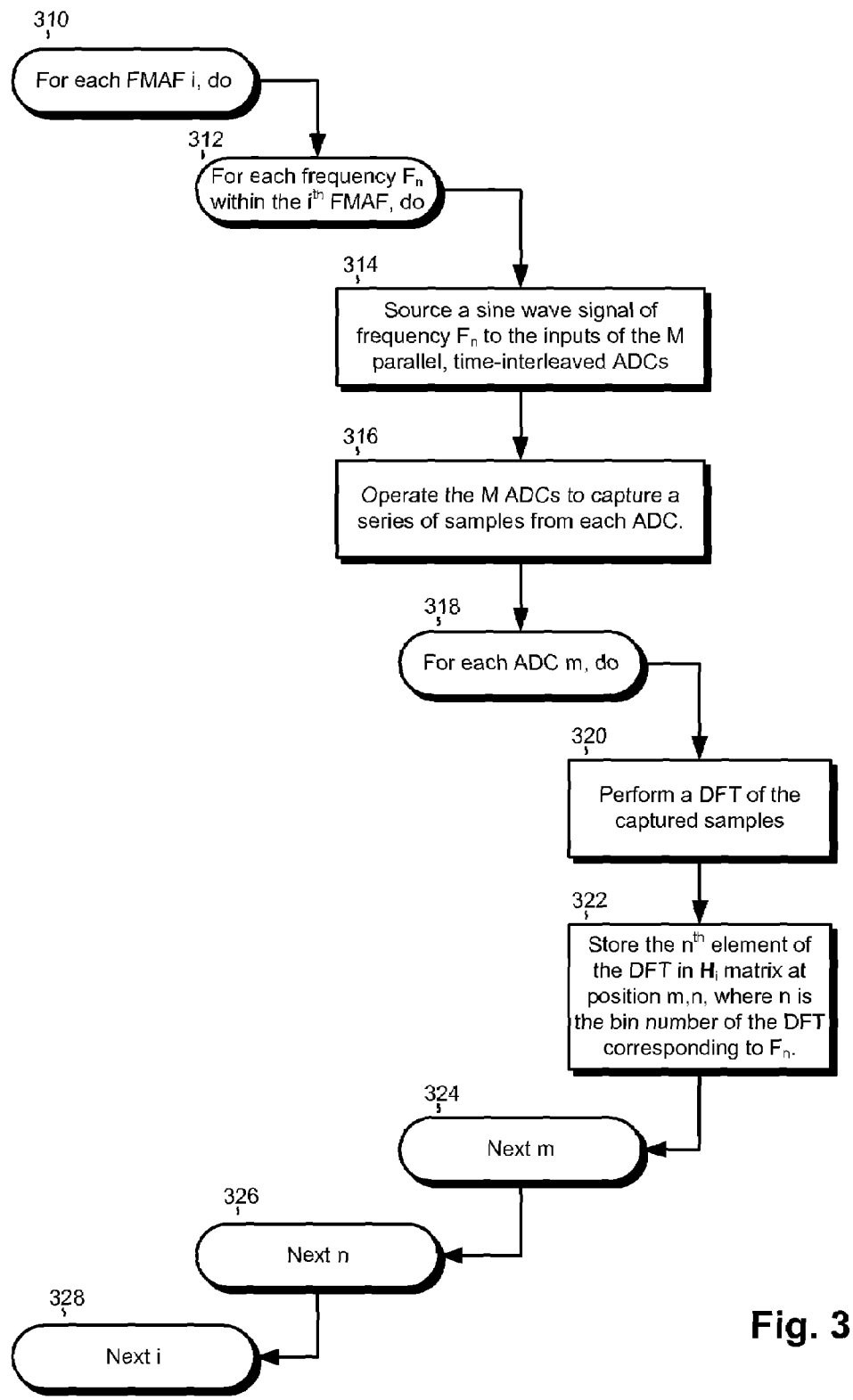
FIG. 3 is a flowchart showing a process according to an embodiment of the invention for acquiring calibration information for a PTIC.

FIG. 3 shows an example of a calibration process for acquiring values for H matrices. This process can be conveniently performed in an ATE system, although it may also be conducted in other contexts.

As stated above, each FMAF includes M frequencies within the range between DC and $MF_S/2$. For each of these M frequencies of a given FMAF, a sine wave having the respective frequency (designated $F_n$) is applied to the PTIC (Step 314). The PTIC is operated and each of its M ADCs is made to capture a series of samples of the sine wave (Step 316). A DFT is performed on each of the resulting M series of samples (Step 320).

At step 322, DFT elements are stored in a matrix, $H_i$. The term "DFT element" refers to the value reported in a bin of a DFT. One DFT element is stored from each of the M DFTs, making a total of M elements stored per frequency. The stored DFT elements come from corresponding bins of the M DFTs, i.e., from a bin n corresponding to the frequency $F_n$. The DFT elements are stored at positions m,n of the matrix, where m is the index of the ADC and n is the bin number of the DFT element to be stored.

The process is then repeated for each frequency of the FMAF. It is noted that all frequencies of any FMAF are reported in the same DFT bin, i.e., bin n, since they all fall within bin n (either directly or through aliasing). Upon the completion of all frequencies of a FMAF, a correction matrix $H_i$ is completed. The matrix may then be inverted and stored for later use.

Steps 312-326 are repeated for each FMAF. A new matrix $H_i$ is constructed, inverted, and stored for each FMAF. The total number of FMAFs for which this process is conducted depends upon the desired frequency resolution and bandwidth. Preferably, the process is repeated for N/2+1 FMAFs, enough to reconstruct a spectrum covering a bandwidth between DC and $MF_S/2$.

Figure 4:
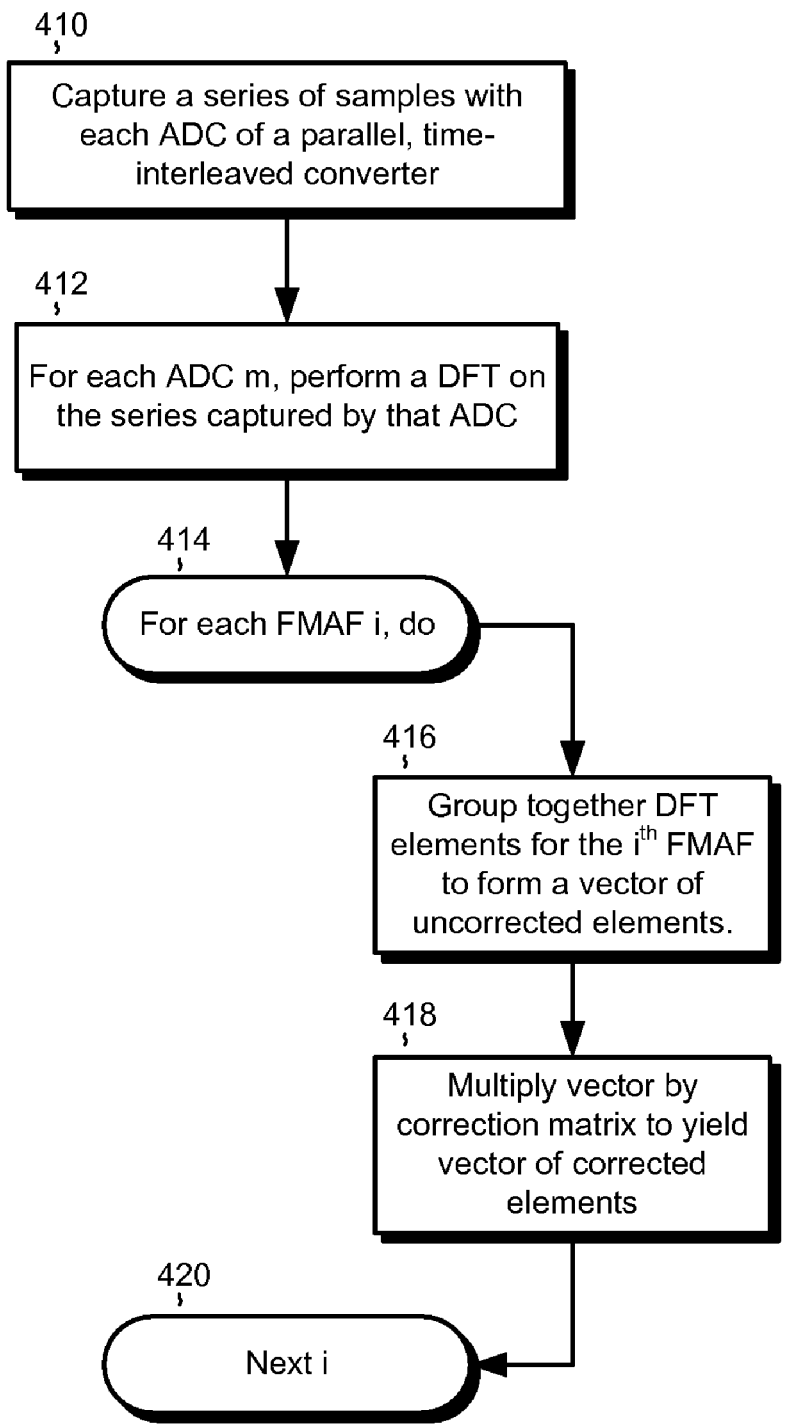
FIG. 4 is a flowchart showing a process according to an embodiment of the invention for applying calibration information to measured input signals.

FIG. 4 shows an example of a process for sampling an input signal with a PTIC and reconstructing the input signal's spectrum. At step 410, each ADC of the PTIC is made to acquire a series of samples of an input signal. At step 412, a DFT is performed on each acquired series. For a PTIC with M different ADCs, M different DFTs are performed.

Next, at step 416, DFT elements for a particular FMAF are grouped together, preferably to form a vector($\tilde{X}_C$ or $\tilde{X}_R$, see EQS. 14 and 20). DFT elements grouped together for any given FMAF all correspond to the same bin number. Therefore, each vector created in step 416 includes M DFT elements, one from the same bin of each of the M DFTs.

At step 418, the vector from step 416 is multiplied by a corresponding matrix, $H_i^{-1}$ (see EQ. 14 and EQ. 20). The matrix $H_i^{-1}$ is simply the inverse of the matrix $H_i$ acquired for the $i^{th}$ FMAF. The product of the M×M matrix with the M×1 vector is an M×1 vector of corrected DFT elements ($\hat{X}_C$ or $\hat{X}_R$). These corrected DFT elements are positioned in the reconstructed spectrum at bin numbers designated in EQS. 13 and 19.

Figure 5:
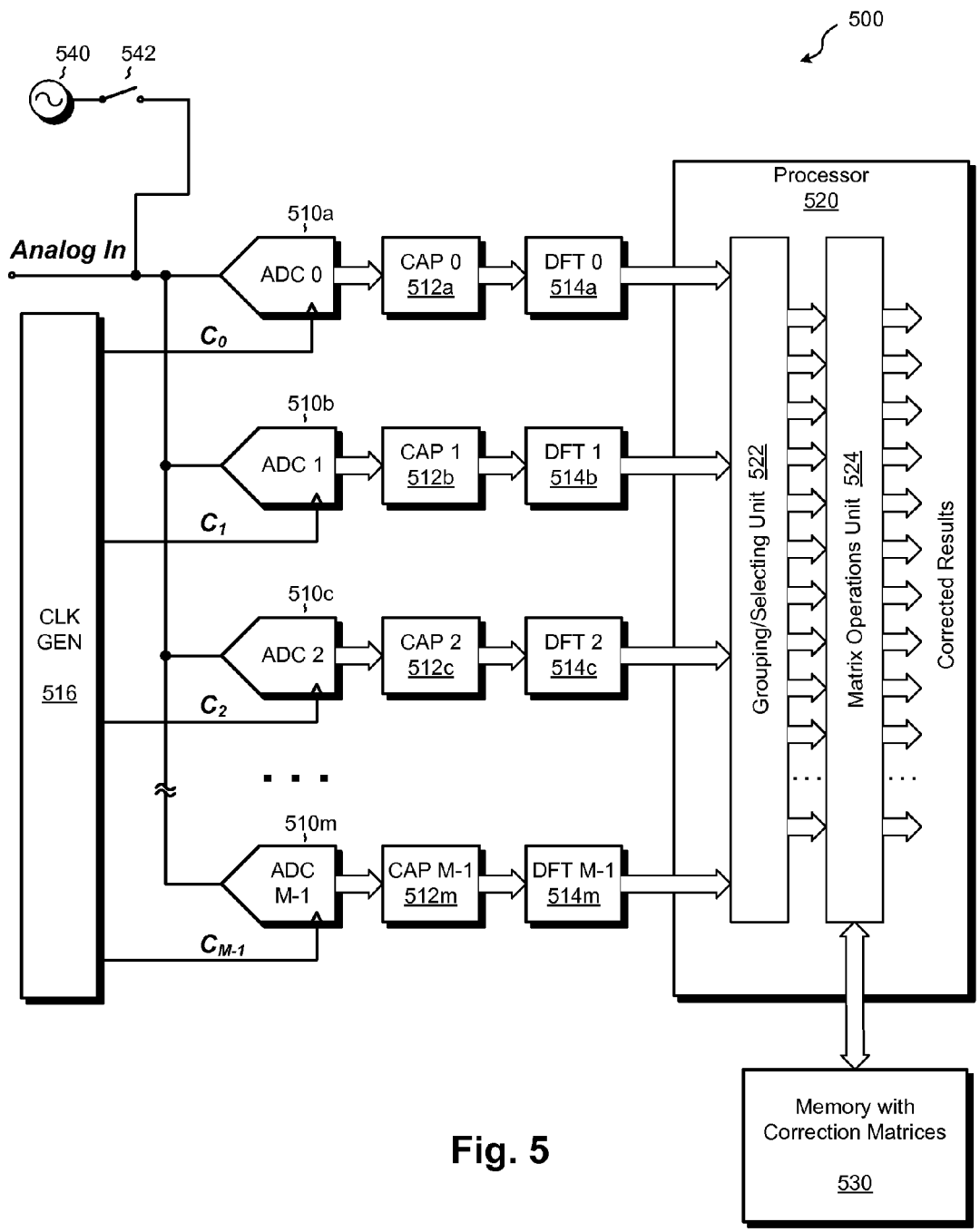
FIG. 5 is a simplified schematic of a PTIC according to an embodiment of the invention.

Steps 416 and 418 are repeated from each FMAF (generally N/2+1 times). It can therefore be seen that M(N/2+1) corrected DFT elements are created, enough to cover the Nyquist band of the reconstructed spectrum. FIG. 5 shows an example of a PTIC that can be used both for calibration and reconstruction. The PTIC 500 is constructed much the same way as the PTIC of FIG. 1. A total of M ADCs 510a-510m each have an analog input, a digital output, and a clock input. The inputs of the M ADCs are coupled together for receiving an input signal, Analog In. A clock generator 516 generates M different clocks, one for each of the ADCs. The M clocks each operate at $F_S$; however, the clocks are time-interleaved so that each has a different phase. The clocks are approximately uniformly distributed in time, so that the effective sampling rate of the PTIC is $MF_S$.

Unlike the PTIC of FIG. 1, the PTIC 500 includes M capture memories 512a-512m, one for each ADC. The capture memories 512a-512m each hold a series of samples acquired by the respective ADC. The PTIC 500 also includes M DFT units 514a-514m. One DFT unit is coupled to the output of each capture memory. Each DFT unit receives a stored series of samples from a respective ADC and is configured for generating a respective DFT. Preferably, each DFT unit operates on a series of N samples of Analog In acquired from a respective ADC at a sampling rate $F_S$.

The M DFT units 514a-514m are each coupled to a processor 520. The processor includes a grouping/selecting unit 522. The grouping/selecting unit is configured for grouping together DFT elements for use in spectrum reconstruction, and for selecting DFT elements for storage in a matrix during calibration. The grouping/selecting unit 522 is coupled to a matrix operations unit 524. The matrix operations unit is configured for performing matrix multiplication, for inverting matrices, and/or for storing DFT values in matrices. The processor 520 is coupled to a memory 530 of correction matrices. During calibration, the memory 530 stores matrix elements. During reconstruction, the memory 530 provides previously stored matrix elements for combination with DFT elements.

The PTIC 500 preferably also includes a signal source 540 and a switch 542. When the switch 542 is closed, the signal source 540 provides accurate calibration signals to the PTIC. These calibration signals include the frequencies used to create the correction matrices during calibration. When the switch 542 is opened, the PTIC 500 can receive input signals to be captured, without interference from the signal source 540.

The ADCs 510a-510m can be of any type that suits the target application. One important characteristic, however, is that the ADCs have sufficient input bandwidth to track Analog In, which is expected to include frequency content up to $MF_S/2$. If the ADCs lack sufficient bandwidth, they should preferably each be provided with an input sample-and-hold circuit that meets the bandwidth requirements. In this event, each sample-and-hold should be connected in series with the input of the respective ADC and receive the respective sampling clock. Each ADC should then be provided with a slightly delayed version of the respective sampling clock.

Figure 6:
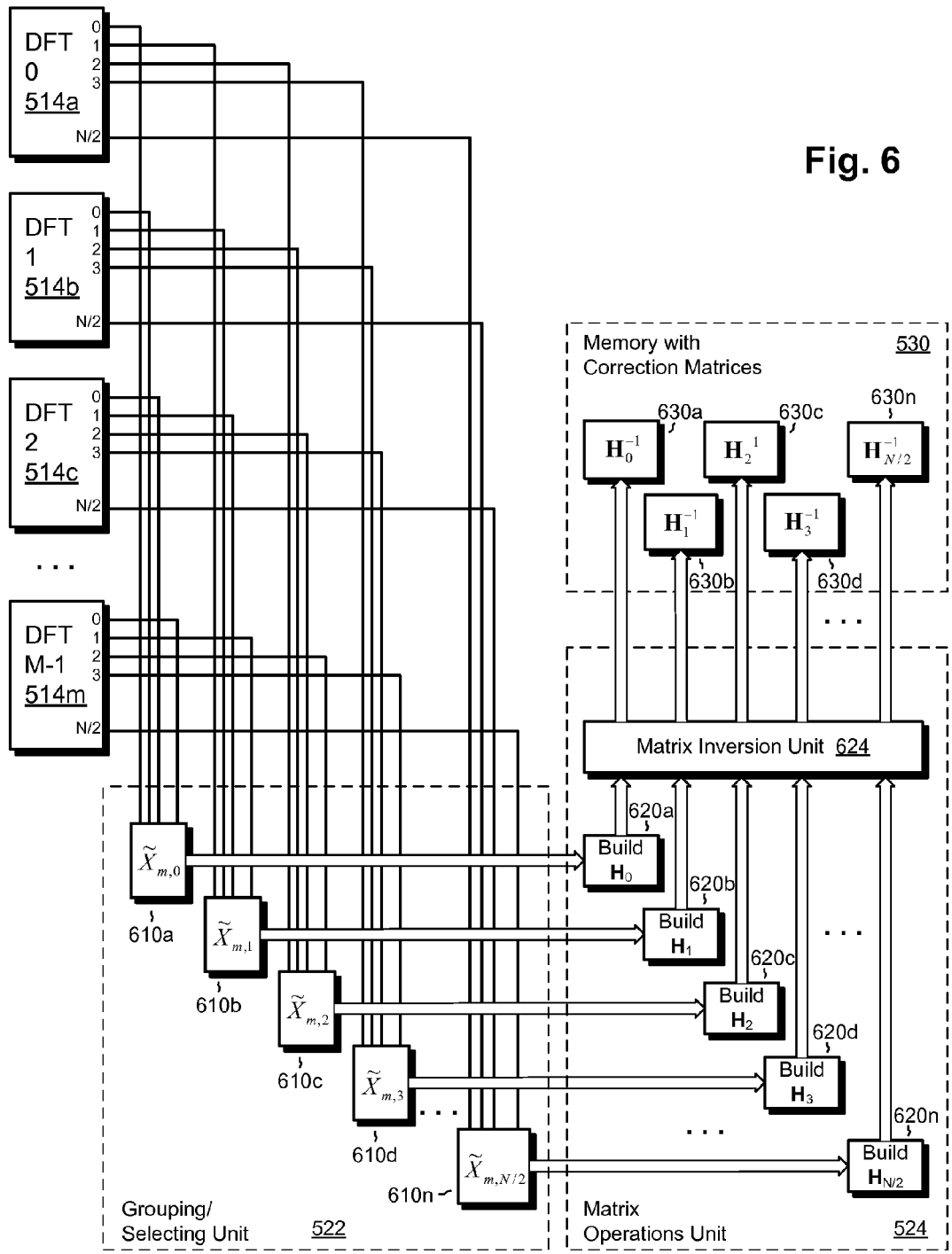
FIG. 6 is a more detailed schematic of portions of the PTIC of FIG. 5 that are involved in calculating and storing calibration information.

FIG. 6 shows certain elements of the PTIC 500, with the PTIC configured for acquiring calibration information. The arrangement of FIG. 6 can be used in connection with the calibration process shown in FIG. 3. As shown, the DFT units 514a-514m provide their outputs, respectively, to selection units 610a-610n. Bins of the DFT units are labeled (0 to N/2). Elements from corresponding bins of the DFT units are coupled to respective selection units 610a-610n. For example, all DFT elements from bin 0 of the DFT units are coupled to selection unit 610a. In a similar manner, all DFT elements from bin 1 of the DFT units are coupled to selection unit 610b, and so forth.

The role of the selection units is to assist in constructing calibration matrices, $H_i$. During calibration and in response DFTs performed on sampled calibration signals, the selection units group together DFT elements according to bin number. Only one of the selection units is active at a time. The active selection unit is the one that groups together the bin number that corresponds to the FMAF currently being calibrated (FMAF$_i$). The grouped elements, each having the general form $\tilde{X}_{m,i}$ are passed to matrix building units 620a-620n in the matrix operations unit 524. As different frequencies within each FMAF are measured, a new matrix $H_i$ is filled in. Upon measurement of all frequencies within a FMAF, the matrix $H_i$ is completed. A matrix inversion unit 624 inverts the matrix $H_i$, and the memory 530 stores the inverted matrix $H_i^{-1}$ for later retrieval. The circuitry of FIG. 6 is reused, for constructing as many matrices $H_i^{-1}$ as desired, preferably N of them.

Figure 7:
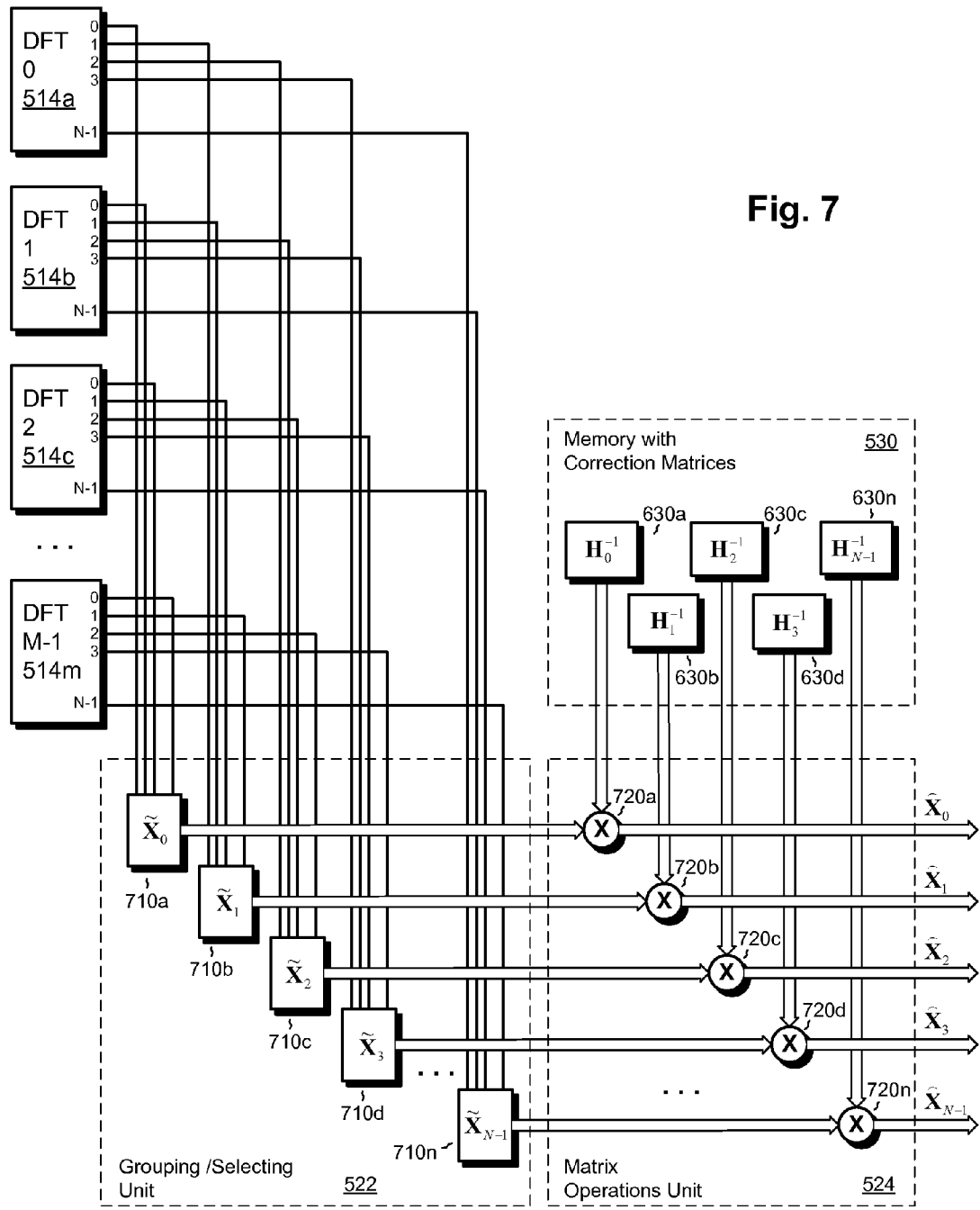
FIG. 7 is a more detailed schematic of portions of the PTIC of FIG. 5 that are involved in applying calibration information to sampled input signals.

FIG. 7 shows certain elements of the PTIC 500, with the PTIC configured for measuring and reconstructing the spectra of input signals. The arrangement of FIG. 7 can be used in connection with the reconstruction process shown in FIG. 4. As shown in FIG. 7, elements from corresponding bins of the DFT units are grouped together to by selection units 710a-710b. For example, selection unit 710a groups together DFT elements from bin 0 of all the DFT units, selection unit 710b groups together DFT elements from bin 1 of all the DFT units, and so forth. Selection units assemble the DFT elements into respective vectors, $\tilde{X}_i$. Preferably, there are a total of N selection units for assembling a total of N vectors.

Once assembled, the vectors are passed to the matrix operations unit 524, where they are multiplied by respective correction matrices, $H_i^{-1}$. Matrix multipliers 720a-720n perform the matrix multiplications, $H_i^{-1}\tilde{X}_i$, to produce respective corrected vectors, $\hat{X}_i$. Values from the corrected vectors are then arranged to form a corrected, reconstructed spectrum.

The model disclosed herein does not directly address offset errors. Offset errors can easily be removed using conventional techniques, i.e., by subtracted previously measured offset values from each ADC sample. We have recognized, however, that offset errors can also be corrected in the frequency domain. By grounding Analog In and directing the PTIC to measure a zeroed input, peaks appearing at DC (bin 0) of each DFT can be measured. The values of these peaks can then be subtracted from respective bin 0 readings acquired from input signals prior to reconstruction.

Performing offset correction in the frequency domain is much simpler than performing it in the time domain, as only M offset corrections need be made (one for each DFT) to reconstruct the spectrum of an input signal. By contrast, correcting offset errors in the time domain requires NM corrections. The techniques disclosed herein have particular applications to ATE. A not an uncommon practice in ATE systems to construct a PTIC from different source/capture instruments 114 having different physical locations within a tester. Oftentimes, instruments within ATE systems are equipped with their own digitizers and DSP engines, with the capability for DFTs to be performed locally. The techniques disclosed herein thus provide a way to make use of these local resources, which would otherwise go unutilized, in performing portions of signal reconstruction. For instance, in an ATE system with multiple digitizers each having its own DSP engine, the digitizers can capture an input signal and perform DFTs locally. Results of DFTs can be sent to a central processor for performing the remaining steps of reconstruction. Because reconstruction so accurately corrects for gain and phase errors, differences between instruments in terms of both gain and timing can be largely if not completely eliminated. Thus, a new and beneficial use can be made of existing instruments.

Figure 10:
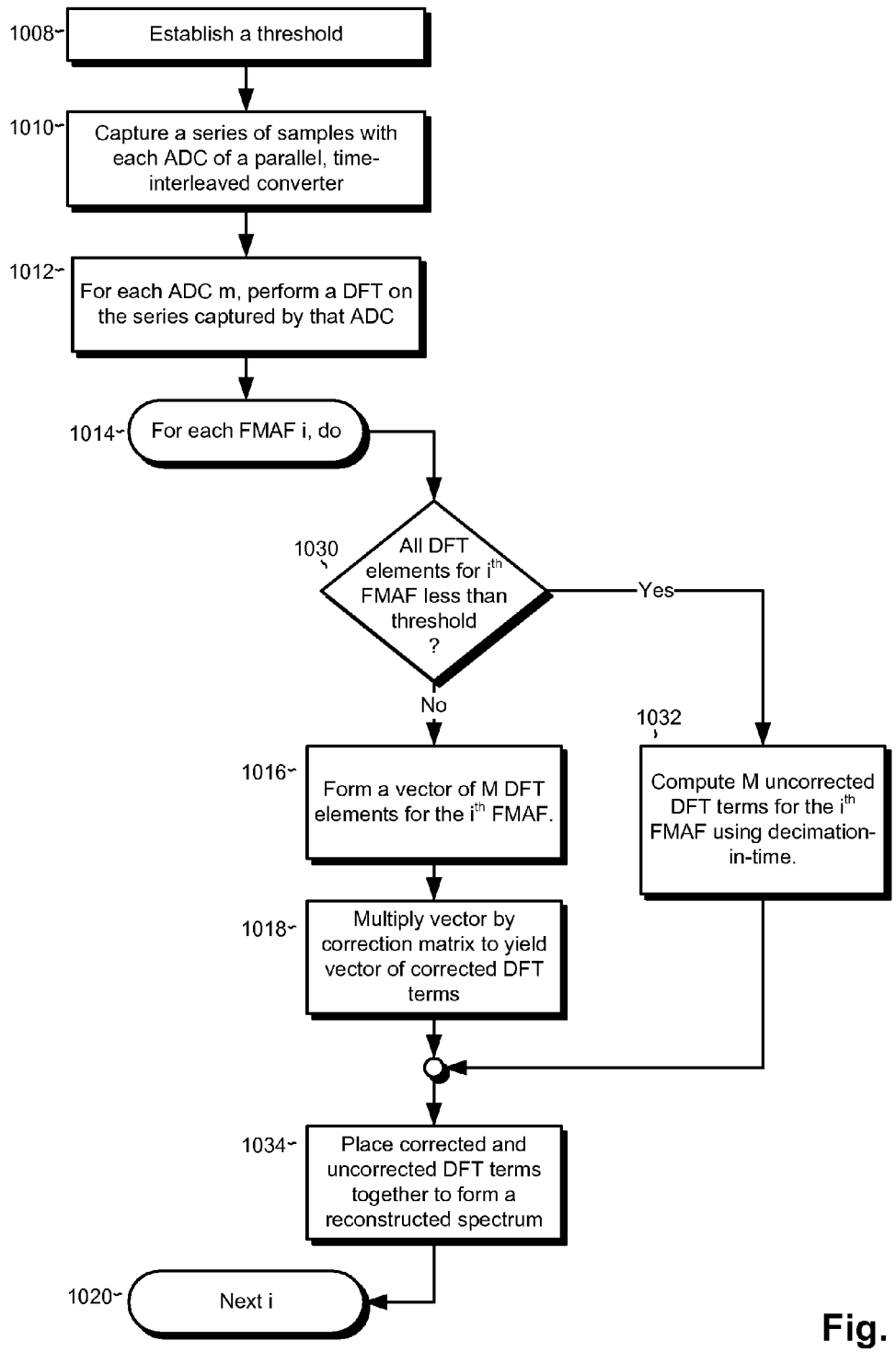
FIG. 10 is a flowchart showing a process of according to an embodiment of the invention for selectively applying calibration information and improving efficiency.

FIG. 10 shows a process for testing a signal in an ATE system, using the principles disclosed herein. At step 810, a UUT (unit under test) is connected to the tester and stimulated to produce a SUT (signal under test). The UUT can be any assembly or device, such as an integrated circuit. The UUT is generally stimulated by supplying it with power, ground, and one or more stimulus signals. In response, the UUT produces the SUT.

At step 812, the SUT is applied to a PTIC circuit. The PTIC circuit can be in the form of a single instrument, or it can be constructed out of different instruments as described above. Alternatively, it can be a circuit built onto a test fixture.

At step 814, the PTIC is made to sample the SUT, and, at step 816, a DFT is performed on each series of samples. Elements from the DFTs are then grouped and corrected (step 818) to produce a reconstructed spectrum of the SUT.

At step 820, the reconstructed spectrum is analyzed to determine whether it meets test requirements. The test requirements can be any measurable characteristics of the SUT, which can be detected from the reconstructed spectrum. Typically, the ATE runs a test program. The test program analyzes the reconstructed spectrum. Depending on the test performed, the test program may measure test requirements such as spurious content, signal-to-noise ratio, or spurious free dynamic range of the reconstructed spectrum.

At step 822, action is taken on the UUT depending upon the test results. If the UUT passes the test, i.e., if test requirements are met, the UUT is generally identified as passing. If the test is done in a manufacturing environment, the UUT may be packaged, labeled, and prepared for shipment. If the UUT fails the test, it may be discarded. If the failure is not catastrophic and merely reflects that the device failed to meet the best possible quality standards, the UUT may be graded according to its tested performance, and labeled accordingly.

The techniques disclosed herein are not limited to ATE. Rather, they can be used advantageously in many applications, including those requiring signal transmission and reception.

FIG. 9 shows a process for transmitting and receiving a signal. At step 910, an input signal to be transmitted is applied to a PTIC circuit. The input signal is sampled by each of the M ADCs of the PTIC (step 912), and a DFT is performed on each resulting series of samples (step 914).

At step 916, elements from the DFTs are grouped and corrected to produce a reconstructed spectrum of the input signal. At step 918, the reconstructed spectrum is transmitted through a communication medium to a receiving device. At step 920, an inverse DFT is performed on the received, reconstructed spectrum, to yield a digital, discrete-time version of the input signal, which can then be reconstituted using a digital-to-analog converter. Alternatively, digital values acquired by the PTIC at any step of reconstruction can be transmitted. Correction and reconstruction of the input signal can thus be performed on either the transmission side or reception side.

The process of FIG. 9 can be used beneficially in any transmission/reception context where real time transmission is not required. Given the large volume of computation required for signal reconstruction, the process is generally not well suited for real time applications. It is a good match for applications such as OFDM (orthogonal frequency-division multiplexing), however, where real time transmission is not required.

In the preferred embodiment, the PTIC 500 is implemented as a source/capture instrument 114 of an ATE system. The clock generator 516 generates clocks for the M ADCs locally, in response to a master clock signal from the clock distribution circuit 112. The signal source 540 is preferably a highly stable, programmable, continuous wave source. DFT units 514a-514m are preferably implemented with separate DSP engines. The processor 520 is preferably a general purpose processor that accesses the DFT units via a data bus. The memory 530 is preferably a non-volatile memory.

The grouping/sorting unit 522 and the matrix operations unit 524 are preferably implemented with software that runs on the general purpose processor. The processor running the software thus assumes the physical configurations shown in FIGS. 6 and 7.

Having described one embodiment, numerous alternative embodiments or variations can be made. For instance, although the elements of the PTIC have been described as residing on a single instrument, this is not required. Alternatively, different elements of the PTIC can be distributed among different instruments or parts of a system. In addition, there is no need for the PTIC to be part of an ATE system. It can alternatively be a stand-alone device, or part of a system for a different application.

The capture memories 512a-512m are shown and described as separate. However, they may alternatively be combined into one or more memory devices. Similarly, the DFT Units 514a-514m need not be separate. Alternatively, they can be implemented with one or more DSP engines, or with one or more processors of a different type. According to one variant, the functions of the DFT units are performed by the processor 520. The processor 520 connects to the capture memories (or memory) via a data bus or other communication medium, and software runs on the processor to perform the DFTs.

According to yet another variant, software that runs encodable instructions for carrying out the various processes is replaced with firmware or hardware. The memory 530 need not be a semiconductor memory. It can alternatively be a magnetic memory, such as a magnetic disk or tape. It can also be an optical memory, such as a compact disk or DVD, or any other device for holding data.

As shown and described, the PTIC acquires calibration factors by performing DFTs on sampled calibration signals. Full DFTs are not required, however. Indeed a more efficient approach is to calculate only a single DFT element for each ADC, at the bin where a reading is expected. Calibration can thus be conducted much faster than if DFT elements are computed for all bins.

Although calibration and reconstruction have been described as covering a full spectrum from DC to $MF_S/2$, this is not required. Alternatively, calibration and/or reconstruction can be limited to one or more parts of a full spectrum, as the target application requires. In addition, calibration need not cover all frequencies of the reconstructed spectrum, even when reconstruction is complete. Certain frequencies can be skipped, and calibration factors for the skipped frequencies can be estimated.

As shown and described, reconstructed spectral components are calculated by solving systems of equations. Those equations are preferably solved with matrix algebra. However, this is merely an example. Other ways of solving systems of equations are known, and the invention is not limited to use with matrices.

As shown and described, a main source of error in a PTIC is caused by discrepancies between its constituent ADCs. We have recognized, however, that correction for converter discrepancies is not always warranted for all DFT terms. Correction of some DFT terms improves measurement accuracy, whereas correction of others does not. For example, correction of noise components does not appreciably improve accuracy. We have recognized that a threshold can be established for a given set of converters, below which errors induced by converter discrepancies are generally less than other errors, such as noise. A great deal of efficiency can be gained by avoiding a full matrix multiplication for each of these low-level terms. A computationally efficient way of handling low-level terms is to produce uncorrected DFT terms. Processing is preferably conducted as follows.

First, we recognize that a DFT, X(k), of a sequence of MN elements x(k) can be expressed via decimation-in-time as the weighted sum of M DFTs each having N elements:

$$X(k)=DFT_N(x_0, x_M, \ldots, x_{(N-1)M})+WDFT_N(x_1, x_{M+1}, \ldots, x_{(N-1)M+1})+W^2DFT_N(x_1, x_{M+1}, \ldots, x_{(N-1)M+1})+ \ldots +W^{M-1}DFT_N(x_{M-1}, x_{2M-1}, \ldots, x_{(N-1)M})$$ (EQ. 21)

The coefficients W are known as "twiddle factors" and have the values $$e^{-j2\pi \frac{k}{NM}}.$$

The index k varies between 0 and MN−1. Taken over all values of k, the values X(k) represent a reconstructed spectrum that is uncorrected for errors in gain or phase.

Twiddle factors and exponentiations thereof have the useful property that they are independent of any input signal and can be computed and pre-stored for all values of k. Also, the DFTs in the above EQ. 21 are identical to those that are already computed by the DFT units 514a-514m (see FIGS. 5 and 7). For example, $DFT_N(x_0, x_M, \ldots, x_{(N-1)M})$ is simply the DFT computed by DFT unit 514a, $DFT_N(x_1, x_{M+1}, \ldots, x_{(N-1)M+1})$ is simply the DFT computed by DFT unit 514b, and so on. Therefore, uncorrected DFT values can be computed for the reconstructed spectrum at little computational cost, which is similar to that required for a prime factor Discrete Fourier Transform. This algorithm can be computed in place.

As desired for computational efficiency and without unduly sacrificing accuracy, uncorrected DFT terms X(k) can be computed and interspersed alongside corrected DFT terms in the reconstructed spectrum. It is shown above that the different elements of a given FMAF can alias to one another. Therefore, components that fall below the threshold before correction may exceed the threshold after correction. However, if all elements of a FMAF fall below the threshold, one can safely assume that no element of the FMAF will significantly exceed the threshold after correction is applied. Therefore, the elements of each FMAF should be considered together as a whole before a decision is made to produce DFT terms of the reconstructed spectrum using EQ. 21 above. If all elements of a FMAF fall below the threshold, then EQ. 21 can be applied to all elements of the FMAF. If any element of the FMAF exceeds the threshold, then EQ. 21 should not be applied to any element of the FMAF.

FIG. 10 shows a summary of the preferred process. This process is similar in part to that shown in FIG. 4, with steps 1010-1014 and 1016-1020 corresponding, respectively, to steps 410-414 and 416-420. At step 1008, however, a threshold is established. The threshold represents the magnitude of DFT terms below which correction for converter discrepancy is not to be performed. Errors in DFT elements arising from converter discrepancies typically account for only about 5% or less of the magnitudes of the respective DFT elements. Correction of DFT elements therefore has a significant effect on accuracy only when DFT elements are at least twenty times larger than the noise floor of a measurement. For smaller elements, the errors are below the noise floor. For this reason, the threshold is preferably set at least a factor of twenty above the RMS noise level of the signal being measured. The threshold can be varied considerably, however, depending upon the circumstances. The higher the threshold is set, the faster the reconstructed spectrum can be generated. The lower the threshold is set, the more accurate correction will be.

At step 1014, processing begins for each FMAF. Control branches at step 1030 based upon whether all DFT elements for the current FMAF are below the threshold. If they are, control proceeds to step 1032, where uncorrected DFT terms X(k) are computed for each element of the current FMAF, according to EQ. 21 above.

If any element of the current FMAF equals or exceeds the threshold, however, control proceeds in the usual fashion, i.e., by forming a vector from DFT elements for the current FMAF (step 1016) and multiplying the vector by a corresponding correction matrix (step 1018), to produce a vector of corrected DFT terms.

Both corrected and uncorrected DFT terms are inserted into the reconstructed spectrum at step 134. The corrected and uncorrected DFT terms are assembled side-by-side in the reconstructed spectrum. Accurate results are obtained for the spectral components for which high accuracy is desired, and computational efficiency is provided for the components for which the need for accuracy is outweighed by the advantages of speed.

The process shown in FIG. 10 can be conducted under any circumstances for which the process of FIG. 4 may be used, such as for testing devices or assemblies (FIG. 8) or transmitting and receiving signals (FIG. 9).

Figure 11:
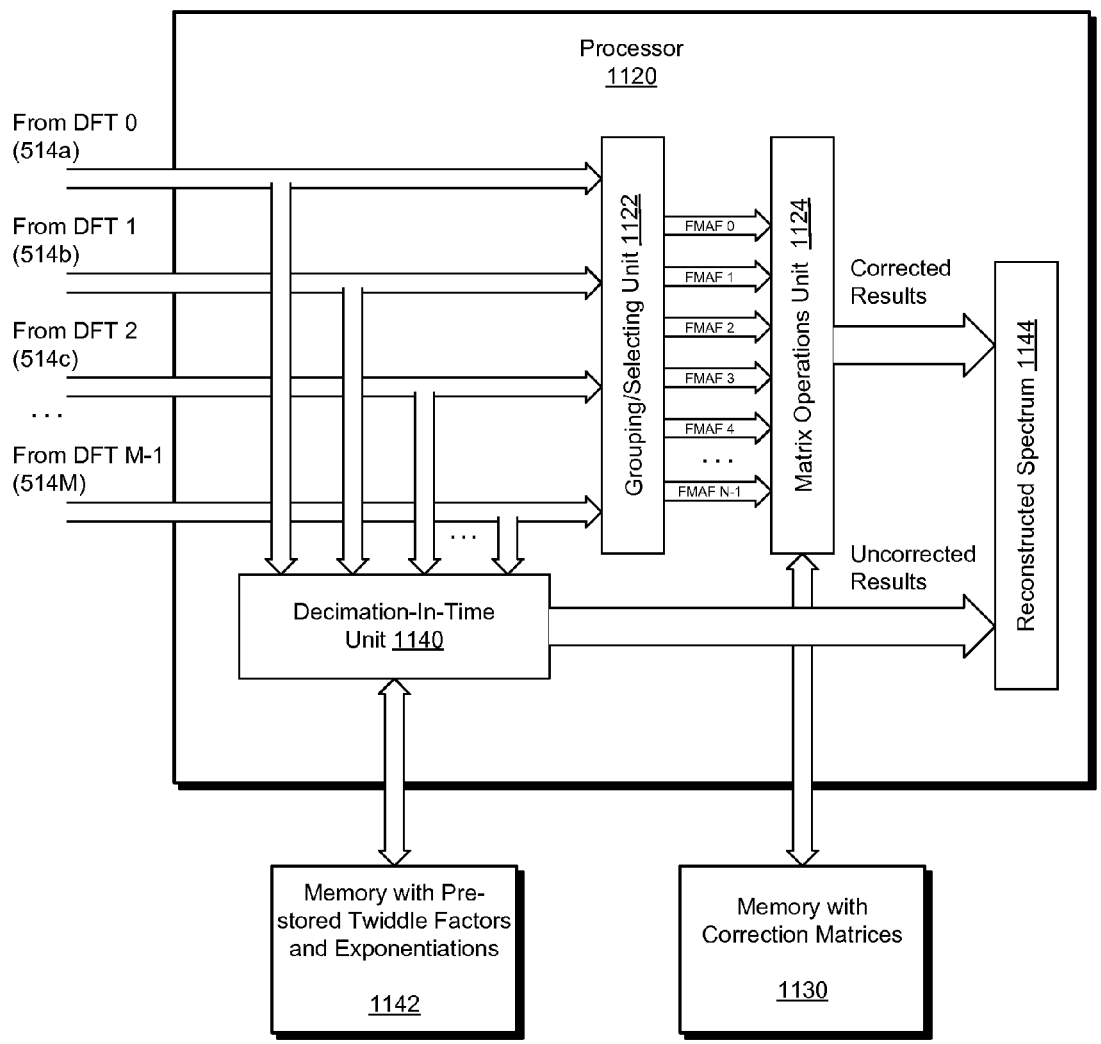
FIG. 11 is a simplified schematic of the processor and memory of a PTIC arranged for selectively applying calibration information and improving efficiency.

FIG. 11 shows an example of a processor 1120 suitable for calculating a reconstructed spectrum that includes both corrected and uncorrected DFT terms. The processor 1120 is similar to the processor 520 of FIG. 5 and may be used in the same contexts. The grouping/selecting unit 1122, matrix operations unit 1124, and memory with correction matrices 1130 of FIG. 11 correspond, respectively, to the elements 522, 524, and 530 of FIG. 5. Unlike the processor 520, however, the processor 1120 includes a decimation-in-time (DIT) DFT unit 1140. The DIT unit 1140 preferably computes uncorrected DFT terms in accordance with EQ. 21. A memory 1142 is preferably coupled to the DIT unit 1140 for providing pre-stored weighting factors (twiddle factors), and exponentiations thereof, for speeding computations.

During operation, the processor 1120 examines the contents of each FMAF, e.g., by examining the outputs of the grouping/selecting unit 1122, and compares them to a threshold. If all DFT elements of a FMAF fall below the threshold, the DIT unit 1140 computes the DFT terms for that FMAF. Otherwise, the matrix operations unit 1124 computes them. Corrected and uncorrected results are combined to form a reconstructed spectrum 1144.

The elements of FIG. 11 are preferably implemented using the same technology as is used to implement the elements of FIG. 5. They may be implemented as functional software elements within a general-purpose computer or a DSP processor. Alternatively, they may be implemented in hardware using an FPGA or an ASIC. The memory 1142 is preferably a non-volatile memory.

Although certain embodiments and variants have been disclosed, the invention is not limited to those embodiments and variants. Those skilled in the art will understand that changes in form and detail may be made to the embodiments disclosed herein without departing from the scope of the invention.

The invention claimed is:

1. A method of testing signals with a PTIC (parallel, time-interleaved converter) that includes M ADCs (analog-to-digital converters) each clocked at a rate $F_S$ and time-interleaved to provide an overall sampling rate of $MF_S$, the method comprising:

(A) stimulating a UUT (unit under test) to produce an SUT (signal under test) having at least one test requirement;
(B) applying the SUT to a PTIC;
(C) acquiring a series of samples of the SUT by each of the M ADCs of the PTIC;
(D) performing a DFT (Discrete Fourier Transform) on each series of samples to yield M DFTs;
(E) sorting the DFT elements from the M DFTs into a plurality of groups according to bin number, wherein each group of the plurality of groups includes M DFT elements each corresponding to the same bin number,
(F) for each group of the plurality of groups,
  (F1) determining whether correction for that group is desired;
  (F2) if it is, processing each group with a collection of correction factors to produce M corrected DFT terms;
  (F3) if it is not, generating M uncorrected DFT terms;
(G) placing corrected and uncorrected DFT elements together to form a reconstructed spectrum of the SUT;
(H) analyzing the reconstructed spectrum to determine whether the UUT meets the at least one test requirement; and
(I) passing, failing, or grading the UUT responsive to the determination of Step H.

2. A method as recited in claim 1, wherein the step F1 of determining whether correction is desired comprises:
comparing each DFT element in the group to a predetermined threshold;
determining that correction is desired if any DFT element in the group exceeds the predetermined threshold; and
otherwise determining that correction is not desired.

3. A method as recited in claim 2, further comprising establishing the predetermined threshold at a magnitude at least twenty times larger than an RMS level of noise of the SUT.

4. A method as recited in claim 1, wherein the at least one test requirement comprises spurious content, signal-to-noise ratio, or spurious free dynamic range.

5. A method as recited in claim 1, wherein the step F3 of generating M uncorrected DFT terms comprises performing mathematical operations on the DFT elements of the M DFTs.

6. A method as recited in claim 1, wherein the step F3 of generating M uncorrected DFT terms comprises performing a decimation-in-time Fast Fourier Transform on the DFT elements of the M DFTs.

7. A method as recited in claim 1, wherein the step F3 of generating M uncorrected DFT terms comprises computing each uncorrected DFT term X(k) according to the equation $$X(k)=DFT_N(x_0,x_M,\ldots,x_{(N-1)M})+WDFT_N(x_1, x_{M+1},\ldots,x_{(N-1)M+1})+W^2DFT_N(x_1, x_{M+1},\ldots,x_{(N-1)M-1})+\ldots+W^{M-1}DFT_N(x_{M-1}, x_{2M-1},\ldots,x_{(N-1)M}),$$

wherein k is an index corresponding to a position of the uncorrected DFT term in the reconstructed spectrum,
wherein N is the number of DFT terms in each of the M DFTs,
wherein the expression $DFT_N(x_0,x_M,\ldots,x_{(N-1)M})$ represents the DFT elements of a first of the M DFTs, $DFT_N(x_1,x_{M+1},\ldots,x_{(N-1)M+1})$ represents the DFT elements of a second of the M DFTs, and so forth, and
wherein W represents a weighting coefficient having the form $$e^{-j2\pi\frac{k}{NM}}.$$

8. A method as recited in claim 7, further comprising, prior to step A:
calculating each weighting coefficient W included in the equation of claim 7.

9. A method as recited in claim 8, further comprising:
storing, prior to step A, each calculated weighting coefficient included in the equation of claim 7 on a computer-readable medium; and
accessing the computer-readable medium to retrieve each stored weighting coefficient for use in calculating the uncorrected DFT terms.

10. A method as recited in claim 8, further comprising, prior to step A:
calculating each exponentiation of each weighting coefficient W included in the equation of claim 7;
storing, prior to step A, each calculated exponentiation of each weighting coefficient included in the equation of claim 7 on a computer-readable medium; and accessing the computer-readable medium to retrieve each stored exponentiation of each weighting coefficient for use in calculating the uncorrected DFT terms.

11. A method as recited in claim 1, wherein each of the plurality of collections of correction factors is arranged as an M×M matrix of correction factors, wherein one dimension of the matrix corresponds to ADC (1–M) and the other dimension of the matrix corresponds to frequency.

12. A method as recited in claim 1, wherein the step (F2) of processing includes correcting for any of gain errors, offset errors, and phase and/or timing errors.

13. A method of transmitting and receiving a signal, comprising:
(A) applying a signal to a PTIC (parallel, time-interleaved converter) that includes M ADCs (analog-to-digital converters) each clocked at a rate $F_S$ and time-interleaved to provide an overall sampling rate of $MF_S$;
(B) acquiring a series of samples of the signal by each of the M ADCs of the PTIC;
(C) performing a DFT (Discrete Fourier Transform) on each series of samples to yield M DFTs each including a plurality DFT elements arranged by bin number;
(D) sorting the DFT elements from the M DFTs into a plurality of groups according to bin number, wherein each group includes M DFT elements each corresponding to the same bin number,
(E) for each group of the plurality of groups,
(E1) determining whether correction for that group is desired;
(E2) if it is, processing each group with a collection of correction factors to produce M corrected DFT terms;
(E3) if it is not, generating M uncorrected DFT terms;
(F) placing corrected and uncorrected DFT elements together to form a reconstructed spectrum of the signal;
(G) transmitting the reconstructed spectrum to a receiving circuit; and
(H) performing and inverse DFT on the received, reconstructed spectrum to reconstruct the signal.

14. A method as recited in claim 13, wherein the step F1 of determining whether correction is desired comprises:
comparing each DFT element in the group to a predetermined threshold;
determining that correction is desired if any DFT element in the group exceeds the predetermined threshold; and otherwise determining that correction is not desired.

15. A method as recited in claim 14, further comprising establishing the predetermined threshold at a magnitude at least twenty times larger than an RMS level of noise of the signal.

16. A method as recited in claim 13, wherein the step E3 of generating M uncorrected DFT terms comprises performing a decimation-in-time Fast Fourier Transform on the DFT elements of the M DFTs.

17. A method as recited in claim 13, wherein the step E3 of generating M uncorrected DFT terms comprises computing each uncorrected DFT term X(k) according to the equation $$X(k) = DFT_N(x_0, x_M, \ldots, x_{(N-1)M}) + WDFT_N(x_1, x_{M+1}, \ldots, x_{(N-1)M+1}) + W^2 DFT_N(x_1, x_{M+1}, \ldots, x_{(N-1)M-1}) + \ldots + W^{M-1} DFT_N(x_{M-1}, x_{2M-1}, \ldots, x_{(N-1)M}),$$

wherein k is an index corresponding to a position of the uncorrected DFT term in the reconstructed spectrum,
wherein N is the number of DFT terms in each of the M DFTs,
wherein the expression $DFT_N(x_0, x_M, \ldots, x_{(N-1)M})$ represents the DFT elements of a first of the M DFTs, $DFT_N(x_1, x_{M+1}, \ldots, x_{(N-1)M+1})$ represents the DFT elements of a second of the M DFTs, and so forth, and
wherein W represents a weighting coefficient having the form $$e^{-j2\pi \frac{k}{NM}}.$$

18. A method as recited in claim 17, further comprising:
calculating, prior to step A, each weighting coefficient W included in the equation of claim 17;
storing, prior to step A, each calculated weighting coefficient included in the equation of claim 17 on a computer-readable medium; and
accessing the computer-readable medium to retrieve each stored weighting coefficient for use in calculating the uncorrected DFT terms.

19. A circuit for analyzing a signal, comprising:
an input;
a clock generator for generating M clocks each operable at a rate $F_S$ and each having a different phase;
M ADCs, each having an analog input coupled to the input, a digital output, and a clock input coupled to the clock generator for receiving a respective one of the M clocks;
M DFT units, each DFT unit respectively coupled to the digital output of one of the M ADCs and constructed and arranged for producing DFT elements; and
a processor, coupled to the M DFT units, for processing the DFT elements from the M DFT units to produce a reconstructed spectrum, the processor having a first portion for producing corrected DFT terms of the reconstructed spectrum and a second portion for producing uncorrected DFT terms of the reconstructed spectrum.

20. A circuit as recited in claim 19, wherein the M DFT units and the processor are functional units incorporated within a data processing system.

21. A circuit as recited in claim 20, wherein the data processing system is a digital signal processing system.

22. A circuit as recited in claim 19, wherein the processor further includes encoded instructions for grouping DFT elements produced by the M DFT units into groups according to bin number and, for each group, determining whether to produce corrected or uncorrected DFT terms for that group.

23. A circuit as recited in claim 19, further comprising a memory that stores a plurality of sets of calibration factors, wherein each set of calibration factors corresponds to a different bin number.

24. A circuit as recited in claim 23, wherein the processor includes encoded instructions for sorting DFT elements from the M DFT units into groups according to bin number, and encoded instructions for algebraically combining the group for each bin number with the set of calibration factors for the corresponding bin number, for generating corrected DFT terms.

25. A circuit as recited in claim 19, wherein the second portion of the processor comprises a decimation-in-time DFT unit.

26. A circuit as recited in claim 19, further comprising a memory coupled to the second portion of the processor for storing weighting factors for use in calculating uncorrected DFT terms.

* * * * *